United States Patent [19]

Sarwinski et al.

[11] Patent Number: 5,003,276
[45] Date of Patent: Mar. 26, 1991

[54] METHOD OF SITE SHIMMING ON PERMANENT MAGNETS

[75] Inventors: Raymond E. Sarwinski; Bruce C. Breneman, both of San Diego, Calif.

[73] Assignee: General Atomics, San Diego, Calif.

[21] Appl. No.: 392,609

[22] Filed: Aug. 11, 1989

[51] Int. Cl.⁵ .............................................. H01F 7/02
[52] U.S. Cl. .................................... 335/304; 335/306
[58] Field of Search ............. 335/296, 297, 298, 301, 335/304, 306; 324/318, 319, 320

[56] References Cited

U.S. PATENT DOCUMENTS

| | | | |
|---|---|---|---|
| 2,777,099 | 1/1957 | Foss | 317/158 |
| 3,223,897 | 12/1965 | Sullivan | 335/298 |
| 4,445,102 | 4/1984 | Thorn et al. | 335/297 |
| 4,498,048 | 2/1985 | Lee et al. | 324/307 |
| 4,672,346 | 6/1987 | Miyamoto et al. | 335/296 |
| 4,673,882 | 6/1987 | Buford | 335/298 X |

Primary Examiner—George Harris
Attorney, Agent, or Firm—Nydegger & Associates

[57] ABSTRACT

Ferromagnetic pieces are mounted on a plurality of nonmagnetic radial rods located at desired locations parallel to a pole face of a permanent magnet used in a magnetic resonance imaging apparatus. The pieces comprise plates which are translatable radially along each rod. Each rod carrying the plates are each rotatable about the rod axis to produce an error field cancelling environmentally induced, low order perturbations. A method for accomplishing same is also included. In a preferred embodiment, the plates are mounted on radial rods positioned at equal angles from one another, preferably thirty degrees (30°) apart and arranged as spokes of a wheel.

22 Claims, 3 Drawing Sheets

METHOD OF SITE SHIMMING ON PERMANENT MAGNETS

FIELD OF THE INVENTION

This invention relates generally to a method and apparatus for controlling the uniformity of a magnetic field across a large air gap. More specifically, the invention relates to a method and apparatus which utilizes permanent magnets for nuclear magnetic resonance imaging (MRI). The present invention is particularly, though not exclusively, useful for fine tuning the uniformity of a magnetic field, into which a patient can be placed for magnetic resonance imaging.

BACKGROUND OF THE INVENTION

Generation of a strong, highly uniform magnetic field is required for nuclear magnetic resonance imaging (MRI). In MRI, there is the ability to form images of biological tissue in vivo. With this ability, MRI of humans for medical diagnostic purposes can be utilized for the early detection of tumors and the like. The MRI phenomenon is a result of the magnetic properties of atomic nuclei and the ability to observe nuclear spin distributions in the presence of a magnetic field. The magnetic field needed for MRI can be generated by electromagnets or permanent magnets.

Different types of magnet systems have been proposed and utilized in an attempt to obtain a highly uniform field, and still realize a reasonable initial cost, simplify site preparation, control cost of operation, and minimize maintenance requirements. Specifically, the types of magnets used for this purpose include superconducting magnets, resistive magnets, and permanent magnets.

Of help in evaluating these magnets are the observations of W. Oldendorf in his article "Nuclear Magnetic Resonance and Correlative Imaging Modalities," published in the *Society of Nuclear Medicine* pp. 45-54, 1983, wherein he compares the advantages and disadvantages of superconducting, resistive and permanent magnets for human MRI. In this publication, Oldendorf notes that superconducting magnets have the advantage of a strong field with high uniformity. He also notes they are, however, expensive to buy and maintain, and that they typically have a large fringe field. Furthermore, they require extensive site preparation. Moreover, they generate only a longitudinal field and require a vacuum and the consequent problems associated with the handling of liquified gases. In comparison, resistive magnets can also have good uniformity and generate a transverse field. In addition, they are relatively inexpensive and require no vacuum or handling of gases. Unfortunately, the strength of resistive magnets is limited, and they further require an elaborate and costly power and water supply. In addition, they require extensive site preparation due to their large weight. Lastly, in comparison, permanent magnets are inexpensive, have minimum site preparation requirements, generate minimal unwanted fringe field, and have no power supply, liquified gas handling or vacuum requirements. Their disadvantages are, however, that permanent magnets have limited field strength, temporal instabilities, are very heavy, and have a field whose uniformity does not meet industry requirements to date. Nevertheless, permanent magnets appear to be a newly developing, cost effective solution for MRI.

As one solution to the problem of creating a uniform and homogeneous flux field for MRI, a general design of a permanent magnet MRI structure has been proposed by Oldendorf which utilizes an external frame of iron supporting two opposed permanent magnets.

To solve the uniformity problem when using permanent magnet systems for MRI tomography, other authors have proposed various types of systems. Unfortunately, most such systems, in order to obtain the field uniformity desired, require an enclosed magnetic field. An enclosed field, however, is not practical as it limits the ease with which the patient can be positioned in the magnetic field. See, for example, "Permanent Magnetic Systems for MRI Tomography" by H. Zijlstra, *Philips Journal of Research*, Volume 40, No. 5, 1985, pp. 259-288. In this article, it is noted that the standard requirement for a magnet system is that it be a full-body magnet with an access diameter of approximately one (1) meter, and a magnetic field uniformity of no more than one hundred (100) parts per million (ppm) within a sphere of one half (0.5) meters diameter. As a practical matter, most MRI devices barely exceed these requirements. It is desirable to attain field uniformity of up to forty (40) parts per million over a spherical volume having a diameter of approximately thirty (30) centimeters.

Various attempts to solve some of the problems involving permanent magnets have been made which include substantially parallel flat plates that support opposed permanent magnets and which are coupled together by a plurality of rod-like yoke portions. Such a device is disclosed in U.S. Pat. No. 4,672,346 to Miyamoto et al. It also includes complicated adjusting mechanisms for moving magnetic materials about with respect to the plates. It further contemplates use with permanent magnets showing a large maximum energy product, on the order of two hundred forty (240) kilojoules per cubic meter, to attain a uniformity of two hundred (200) ppm inside a spherical volume of three tenths (0.3) meters in diameter. It also discloses that addition of a field compensating (heated) shim may improve the uniformity further.

Various attempts have been made to obtain uniform flux fields by varying the pole face topography to attain homogeneity of the flux. One known method which accomplishes some degree of control involves providing a peripheral annular shaped rim which is positioned on the pole face of the magnet. With this method the positions of the central pole faces and rims can be adjusted independently in attempts to e establish a uniform flux field. However, limitations to uniformity have been observed as a result of even slight asymmetries in the geometry of the device. Furthermore, imperfections in the iron or other material being used for the magnet can affect the uniformity in magnetization. See for example the article entitled "Field Homogeneity and Pole Distribution," by J. D. Bjorken and F. Bitter, published in the *Review of Scientific Instruments*, Volume 27, No. 12, December 1956, pp. 1005-1008.

Regardless of the type of magnet used to generate the flux field for MRI purposes, the field needs to have several desirable characteristics. Most importantly, the flux field needs to be uniform and homogeneous in the space where MRI is to be accomplished (i.e. all lines of flux need to be substantially parallel to each other). Also, for overall efficiency, the generation of the flux field should be accomplished as efficaciously as possible. It is necessary further that the apparatus can be easily and conveniently adjustable to attain a highly uniform field once it is at the installation site, e.g. the medical facility. It is desirable to adjust an MRI apparatus in the factory to within two hundred to three hundred (200-300) ppm and then be able to finely adjust the field uniformity to greater uniformity, e.g. thirty to forty (30-40) ppm, without requiring extensive operator training or complicated adjustment apparatus and methods. Such fine adjustments of the field uniformity include minimizing flux field errors to provide greater resolution in magnetic resonance imaging. Attaining such fine tuned condition in the factory would be impractical and inefficient since shipping, handling and environmental site conditions introduce field errors which can only be corrected after installation of the MRI system at the site. However, such method and apparatus to adjust the uniformity to the required level must be simple and convenient to utilize for practical acceptance of such devices.

The present invention also further recognizes that flux field uniformity can be improved by incorporating a method and apparatus superposed adjacent the magnet's pole face for adjustment to establish the required effective uniform field. The field can be defined in three dimensions, x, y, and z, by the known Legendre polynomial expansion, which has coefficients which describe the x, y, and z gradients of the magnetic field. Flux uniformity can be achieved by minimizing lower order error perturbations of the Legendre expansion, or minimizing Legendre coefficients, which account for small variations, by making adjustments at the site. Minimizing higher order perturbations, which account for larger variations, can be more readily accomplished at the factory.

Accordingly, it is an object of the present invention to provide a method and apparatus which is easy and convenient to use to achieve a highly uniform magnetic field suitable for use in MRI. It is another object of the present invention to provide a magnetic field control apparatus which is relatively inexpensive to manufacture, install, operate and maintain while achieving reliable results in operation. It is another object of the present invention to provide a system and apparatus for adjustably fine tuning the uniformity and resolution capability of the magnetic field at the site. Other objects of the present invention will become apparent in the full description of the invention taken in conjunction with the drawings set forth below.

SUMMARY OF THE INVENTION

An apparatus for site shimming a permanent magnet having a flat pole face comprises a long, slender straight nonmagnetic rod having first and second ends, and a flat ferromagnetic plate adjustably mounted on the rod at a specified distance from the first end. The rod is supported within a nonmagnetic hollow tube radially in a position parallel to and directly above the pole face, and the rod is rotatable about its longitudinal axis for positioning the plate at a desired angle with respect to the pole face. A plurality of rods are arranged radially like the spokes of a wheel at equal angles, each rod carrying a plate. The plates may be circular, rectangular or elliptical.

Also included is a method of site shimming including the steps of providing a nonmagnetic rod having a first end, mounting a flat, ferromagnetic plate onto the rod at a first distance from the first end, radially positioning the rod carrying the plate directly above and parallel to the flat pole face, and rotating the rod about its longitudinal axis for positioning the plate in a desired orientation with respect to the pole face. Also included is the step of measuring the uniformity of the magnetic field strength in a central field adjacent the pole face to determine the values of zonal and tesseral perturbations in the field. These measurements are used to determine the distance from the first end of the rod at which the plate is to be positioned. In addition, the measurements are used to determine the proper angle of the plane in which the plate should be oriented, by rotating the rod about its longitudinal axis to the proper orientation. This minimizes the zonal and tesseral perturbation values.

The novel features of this invention, as well as the invention itself, both as to its structure and its operation, will be best understood from the accompanying drawings, taken in conjunction with the accompanying description, in which similar reference characters refer to similar parts, and in which:

DESCRIPTION OF THE PREFERRED EMBODIMENT

Figure 1:
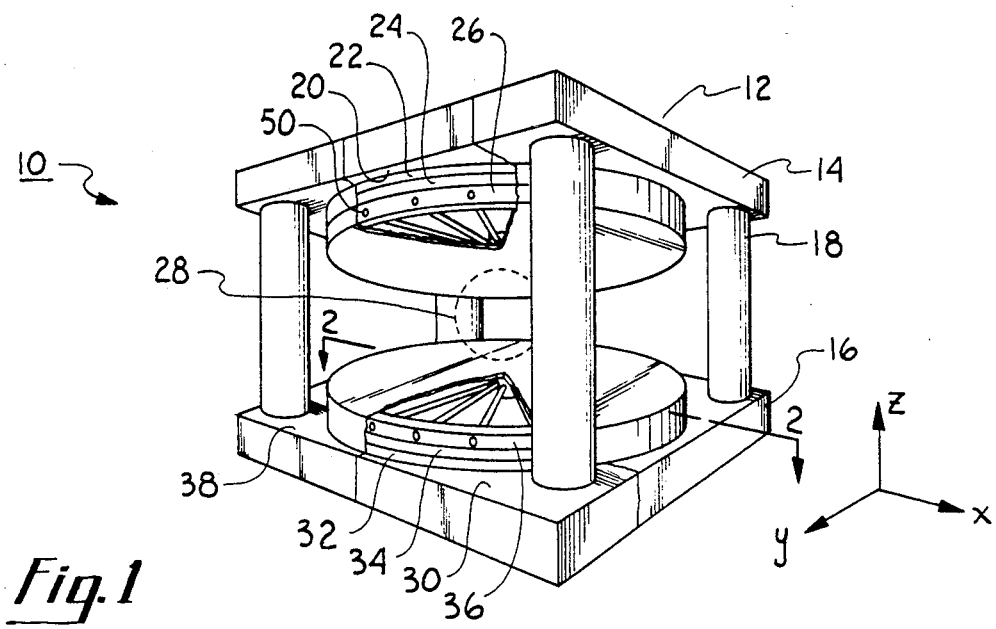
FIG. 1 is a perspective view of the present invention shown being used in its intended environment.

FIG. 1 shows the apparatus for site shimming a permanent magnet in its intended operating environment in accordance with the present invention, generally designated as 10. In particular, a frame generally indicated as 12 comprises an upper base member 14 superposed directly above and parallel to a lower base member 16. Upper base member 14 is supported in its position spaced apart from the lower base member 16 by a plurality of columns 18, which may advantageously be an even number, such as four, shown in the embodiment presented in FIG. 1. Having an even number of support columns 18 conveniently facilitates a symmetrical configuration to assist in obtaining a uniform magnetic field as will be further appreciated below. On the inner face 20 of upper base member 14 there is attached thereto a layer of permanent magnetic material 22 of sufficient strength to generate the magnetic field desired. The upper base member 14, lower base member 16, and columns 18 are of a ferromagnetic material such as iron (Fe), nickel (Ni), cobalt (Co) or various alloys that may advantageously exhibit high magnetic permeability, and there is a sufficient amount of material to prevent saturation thereof.

Adjacent layer of permanent magnetic material 22 and connected thereto is a pole face 24 which may be in the form of a thin, flat circular piece of ferromagnetic material, having a substantially flat surface on the inner side thereof. Connected to the outer rim of the circular pole face 24 is an annular member 26 of ferromagnetic material. There may be conveniently mounted on the annular member 26 a set of shim segments (not shown) which are utilized to adjustably control uniformity of the magnetic field generated within the apparatus in the factory and during assembly of the apparatus as will be more fully explained below.

Likewise, on lower inner face 30 of lower base member 16 there is mounted lower layer 32 of permanent magnetic material oppositely positioned substantially parallel to and symmetrical with the upper layer 22 of permanent magnetic material. Permanent magnetic material layer 32 has a charge opposite that of the permanent magnetic material layer 22 for establishing a spherical volume of uniform magnetic field 28, having a desired diameter preferably at least three tenths (0.3) meters, within which the magnetic field is greatly uniform. Contiguous with the permanent magnetic material layer 32 is a lower pole face 34 of ferromagnetic material, which is also a substantially circular, thin flat piece having the same dimensions as the pole face 24. Likewise, there is a lower annular member 36 on the periphery of lower pole face 34 made of ferromagnetic material and having dimensions similar to upper member 26. Member 36 also preferably includes a set of shim segments. There may optionally be a covering of insulating material 38 which envelops the entire apparatus 10, to provide a convenient covering for maintaining the integrity and protecting the inner components of the apparatus from the environment, as well as insulating the permanent magnetic materials from fluctuations in environmental temperatures which greatly affect the magnetic field strength.

Figure 2:
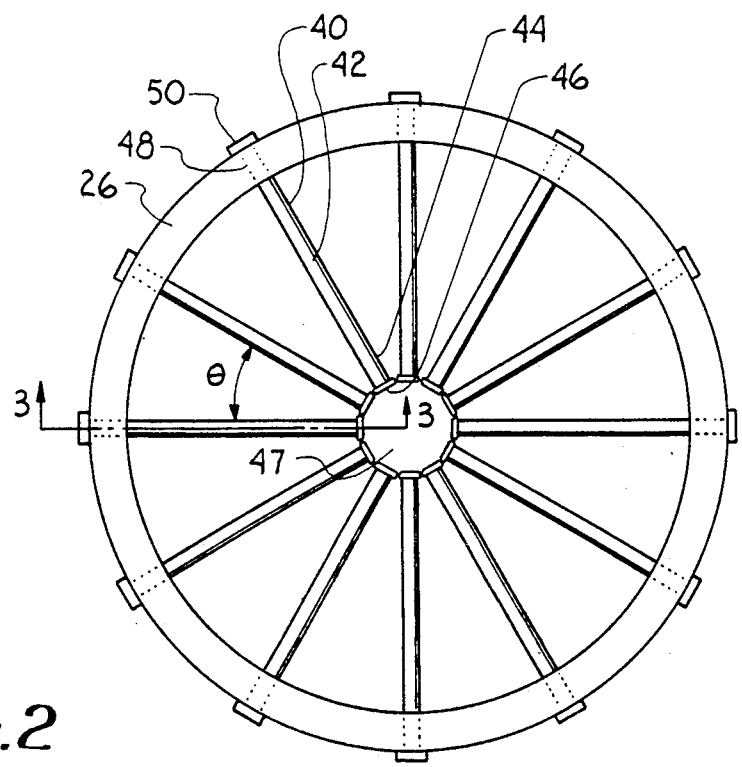
FIG. 2 is a top sectional view taken along line 2—2 of a portion of the embodiment shown in FIG. 1.

Referring now to FIG. 2, there is shown further the components of apparatus 10 in accordance with the present invention. The annular member 26 supports a first end 40 of a hollow tube 42. The tube 42 is made of nonmagnetic material and has a second end 44 to which is fixed an end support 46. End support 46 has one edge secured to the center portion 47 of pole face 24 to provide a support for the tube 42 as further described herein. It should be appreciated that the description with respect to FIG. 2 of the arrangement of end support 46 and tubes 42 applies equally well to the lower pole face 34 as it does to the upper pole face 24, with positioning of the apparatus being symmetrical to achieve maximum homogeneity of the magnetic field.

As further shown in FIG. 2, there are a plurality of tubes 42 arranged radially in fixed position, similar to the spokes of a wheel, about the center portion 47 at angles $\theta$ from one another. The first end 40 of each tube 42 is inserted in a hole 48 and securely fastened in the annular member 26 which supports tube 42. A removable cap 50 is placed on the end thereof and removably attached to annular member 26. In the embodiment shown, there are a plurality of such tubes 42 provided for each pole face, with twelve (12) being illustrated in the drawings.

Figure 3:
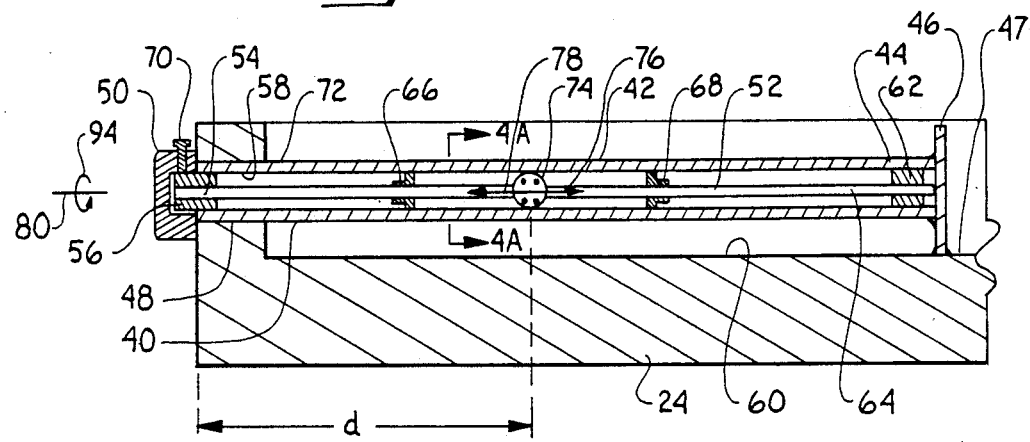
FIG. 3 is a side view, partially in cross section taken along line 3—3, of a portion of the embodiment of the present invention shown in FIG. 2.

The components of each tube 42 can be better appreciated with reference to FIG. 3, wherein it is shown that the tube 42, which is generally cylindrical, carries a nonmagnetic, rigid support rod 52. The support rod 52 is adjustably supported and has attached to its first end 54 a first spacer 56. First end 54, having first spacer 56 attached thereto, is adjustably carried within the inner surface 58 of tube 42. Second end 64 of rod 52 has a second spacer 62 attached thereto. Second spacer 62 is also slidably carried in tube 42. A pair of auxiliary spacers 66, 68 are also slidably mounted on a rod 52 to provide additional stabilizing to rod 52 within tube 42. The rod 52 is supported so it is substantially parallel to inner surface 60 of pole face 24. The tube 42 and rod 52 are preferably made of nonmagnetic material. Cap 50 includes a set screw 70 engageable with first spacer 56 to hold rod 52 securely at the proper angular orientation with tube 42 as discussed below.

There is further shown in FIG. 3 a ferromagnetic piece 74 of material. It is preferably adjustably mounted on the rod 52. Ferromagnetic piece 74 is preferably a flat plate having a generally flat surface. It is preferably circular, but may be rectangular or elliptical, which shape has different affects on the magnetic field as will be explained hereinafter. Ferromagnetic piece 74 is movable generally along the axis 80 of rod 52 in the direction of arrows 76 or 78. One preferred embodiment of the ferromagnetic piece 74 is further shown in detail in FIGS. 4A, 4B, 4C, and FIG. 5.

Figure 4A:
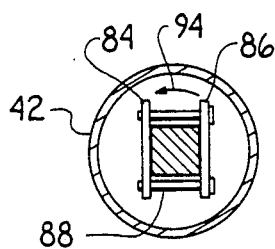
FIG. 4A is an end cross-sectional view taken along line 4A—4A of the portion of the embodiment shown in FIG. 3.

As shown in the embodiment illustrated in FIG. 4A, ferromagnetic piece 74 may be in the form of a pair of thin parallel plates 84, 86 held together by bolts 88, or other suitable fastening devices, on rod 42 having a substantially rectangular cross section. As further shown with respect to FIGS. 4A, 4B, and 4C, the rod 52 may have a square cross section which allows plates 84, 86 to be mounted flush against the sides of rod 52. Each ferromagnetic plate 84, 86 is preferably on the order of one-sixteenth (1/16) of an inch thick and on the order of five-eighths ($\frac{5}{8}$) inches in diameter With respect to FIG. 5, there is one ferromagnetic plate 84 having four holes 82 for utilizing fastening bolts, or other conventional fasteners for fastening the plate 84 to the other plate 86 for holding each firmly in a fixed longitudinal position on rod 52 (not shown in FIG. 5).

Figure 5:
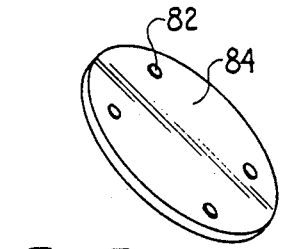
FIG. 5 is a perspective view of one embodiment of a plate utilized in accordance with the present invention.
Figure 8A:
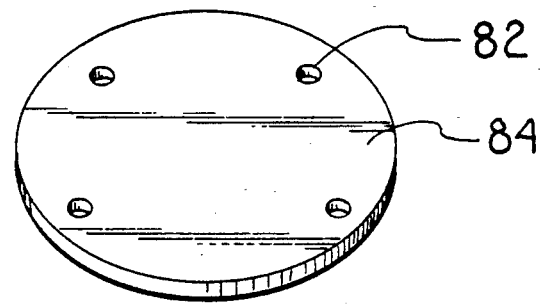
FIG. 8A is a perspective view of a circular plate utilized in accordance with the present invention.
Figure 8B:
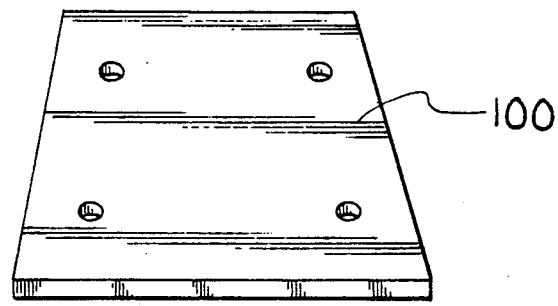
FIG. 8B is a perspective view of a rectangular plate utilized in accordance with the present invention.
Figure 8C:
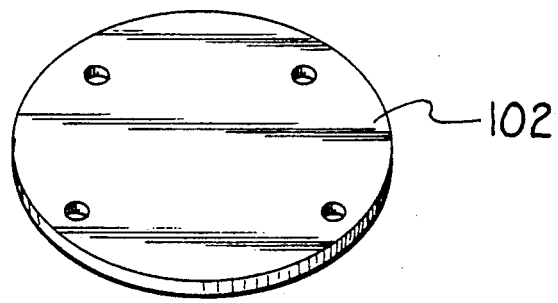
FIG. 8C is a perspective view of an elliptical plate utilized in accordance with the present invention.

The ferromagnetic plate 84, shown in FIG. 5, can be made into a variety of geometric shapes. In particular, FIG. 8 shows three possible shapes for the plate 84. FIG. 8A depicts the substantially circular plate 84, as shown in the preferred embodiment, with fastening holes 82. In alternate embodiments, a ferromagnetic plate 100 which is substantially rectangular or a plate 102 which is substantially elliptical may be used. These alternate embodiments are depicted in FIGS. 8B and 8C, respectively.

Figure 6:
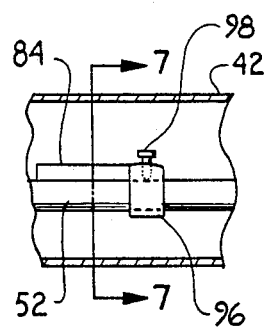
FIG. 6 is a side view of an alternative preferred embodiment of a ferromagnetic pole piece according to the present invention.
Figure 7:
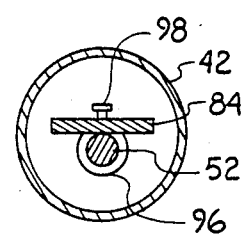
FIG. 7 is an end cross-sectional view of an alternative embodiment taken along line 7—7 of FIG. 1.

Another preferred embodiment of the adjustable ferromagnetic piece 74 is that illustrated in FIGS. 6 and 7. A single plate 84 is attached to a slidable support 96. Support 96 is slidably mounted on a rod 52 having a generally circular cross section, but with a flat top. Slidable support 96 has a set screw 98 which is engageable with the flat surface of rod 52 to fix plate 84 at a specified position on the rod 52.

Referring again to FIG. 3, it may readily be seen that the ferromagnetic piece 74 may be translated radially with respect to the center of the pole face 24, generally in the direction of arrows 76, 78 to adjustably position ferromagnetic piece 74 at some desired location with respect to a desired distance "d" from the first end 54 of the rod 52. Moreover, tube 42 is preferably a three-fourths (¾) outside diameter tube, nonmagnetic, and the distance from the central axis 80 of the rod to the surface 60 of pole face 24 may be also approximately three-fourths (¾) of an inch.

Figure 4B:
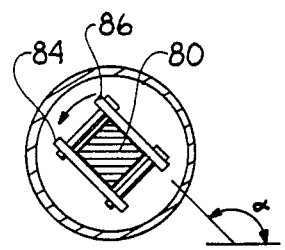
FIGS. 4B and 4C are end cross-sectional views similar to that shown in FIG. 4A at various positions in carrying out the method utilizing the apparatus of the present invention.
Figure 4C:
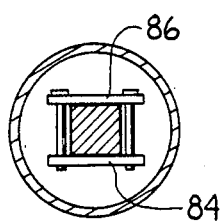

Moreover, as further shown in FIGS. 4B and 4C, the ferromagnetic piece 74 comprised of plates 84, 86 may be rotated about the axis 80 of rod 52 to any desired angle of orientation $\alpha$ with respect to the plane of the pole face 24. The piece 74 may be rotated to one hundred eighty degrees (180°) as shown in FIG. 4C from the position shown in FIG. 4A. As will be explained below, this results in different effects on the components of the magnetic field generated between the pair of pole faces 24 and 34.

In operation, the apparatus 10, is preferably adjusted at the factory by use of rose shims and other factory adjusting apparatus, prior to application of insulating material 38. This attains a field uniformity of between two hundred (200) to three hundred (300) ppm, or less. This uniformity is measured within a required diameter of spherical volume, e.g. three tenths (0.3) meters, while in the presence of a central field of from six hundredths (0.06) tesla to three tenths (0.3) tesla. Once adjusted at the factory, the apparatus 10 is shipped to the desired site of installation and installed in the desired location site. The site typically has various environmental factors associated therewith, such as site shielding, and fringe fields as a result of building construction and the like.

Once installed at the site, the distribution of the magnetic field gradients in the x, y, and z directions can be measured and mapped for the device by conventionally known devices. This may be accomplished using, for example, an MRI tesla meter or magnetometer for measuring data. This data can be utilized to give a three-dimensional plot of magnetic field gradient values at points on the surface of a sphere. This typically involves measuring eighty-four (84) to one hundred forty-four (144) points on the surface of the sphere, to give a graph and map of the field gradients.

Once the points have been measured to obtain the data, the data can be analyzed using a computer to obtain the error coefficients of the Legendre polynomial expansion. The computer model can then iteratively solve for a best solution using the data and provide a distance "d", angle $\alpha$ and field strength which minimizes the error coefficients. The values of the Legendre coefficients are thus related to the radial distance "d" and desired angle of orientation $\alpha$. The magnetic field may then be variably adjusted by rotating the rod and the plates attached thereto. Thus, by properly moving ferromagnetic piece 74 to the proper radial distance "d" on each rod 52, and by properly orientating the angle $\alpha$ of each piece 74, the error coefficients of the field in the x, y, and z directions can be conveniently minimized. This further improves homogeneity in the field.

The necessary adjustments at the site may be simply accomplished by removing the cap 50 and setting piece 74 to the proper distance "d". Then, cap 50 may be replaced and rod 52 turned in a direction, such as indicated by arrow 94, to the desired angular orientation $\alpha$, and tightening set screw 70. Thus, by translating ferromagnetic piece 74 radially, and by rotating it to the proper orientation, error fields can be adjusted to cancel the environmentally induced low order perturbations. These perturbations are defined in rectangular coordinates as the x, y, zx, zy, xy, $x^2-y^2$, z, $z^2$, and $z^3$ coefficients of the Legendre expansion. The Legendre expansion defines the field in three dimensions, namely x, y, and z. Thus, a plurality of radial rods located circumferentially, so as not to introduce higher order perturbations to the field, can carry the ferromagnetic pieces 74 to allow the magnetic field to achieve the uniformity required for fine tuning at the site. This is in addition to the factory shimming. It is impractical to attempt to correct for environmental effects which are unknown until the device is installed at the site. Thus, permanent magnets can be used further in magnetic resonance imaging and take advantage of the low capital and operating costs, minimal fringe fields, and open access, yet obtain the magnetic field uniformity, stability, and accuracy required for successful MRI techniques.

While the particular method of site shimming on permanent magnets as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

What is claimed is:

1. A method of site shimming a permanent magnet having a substantially flat pole face, comprising the steps of:
   providing support means having a first end;
   mounting a flat ferromagnetic plate onto said support means at a first distance from said first end;
   positioning said support means with said plate mounted thereon directly above and parallel to said flat pole face; and
   moving said support means to position said mounted plate in a desired orientation with respect to said pole face.

2. A method of site shimming a permanent magnet having a substantially flat pole face as recited in claim 1, further comprising the step of remounting said plate at a second distance from said first end.

3. A method of site shimming a permanent magnet having a substantially flat pole face as recited in claim 1, wherein said support means positioning step includes radially positioning a plurality of rotatable support rods arranged like the spokes of a wheel generally parallel to said pole face.

4. A method of site shimming a permanent magnet having a substantially flat pole face as recited in claim 1, further comprising the steps of:
   measuring the uniformity of the magnetic field strength of said magnet in a central field adjacent said pole face to determine the values of perturbations in the field, and mounting said plate on said support means at a distance from said first end; and
   rotating said support means about its longitudinal axis to an orientation to minimize said perturbation values.

5. An apparatus for site shimming a permanent magnet having a substantially flat pole face, comprising:
   a long, slender straight rod having a first end and a second end;
   a flat ferromagnetic plate adjustably mounted on said rod at a distance from said first end;

means associated with said rod and pole face for adjustably supporting said rod in a position parallel to and directly above said pole face; and means associated with said adjustable support means for rotating said rod about its longitudinal axis for positioning said plate at a desired angle with respect to said pole face.

6. An apparatus for site shimming a permanent magnet having a substantially flat pole face as recited in claim 5, wherein said plate is mounted on said rod in a plane parallel to the longitudinal axis of said rod.

7. An apparatus for site shimming a permanent magnet having a substantially flat pole face as recited in claim 6, further comprising a pair of thin, flat ferromagnetic plates mounted onto said rod.

8. An apparatus for site shimming a permanent magnet having a substantially flat pole face as recite in claim 7, wherein said plates are circular.

9. An apparatus for site shimming a permanent magnet having a substantially flat pole face as recited in claim 8, wherein said plate has a diameter approximately equal to the distance between said pole face and said parallel support rod.

10. An apparatus for site shimming a permanent magnet having a substantially flat pole face as recited in claim 5, further comprising a plurality of said rods being arranged radially in a plane parallel to said pole face.

11. An apparatus for site shimming a permanent magnet having a substantially flat pole face as recited in claim 10, wherein said pole face is substantially circular, and said adjustable support means comprises an annular member mounted to the perimeter of said pole face for supporting said first end of each said rod, and an end support fastened to said pole face at the center of said pole face for supporting said second end of each said rod.

12. An apparatus for site shimming a permanent magnet having a substantially flat pole face as recited in claim 11, wherein said adjustable support means comprises a hollow tube connected between said end support and annular member for slidably carrying said rod.

13. An apparatus for site shimming a permanent magnet having a substantially flat pole face as recited in claim 11, wherein there are an even number of rods positioned at equal angles.

14. An apparatus for site shimming a permanent magnet having a substantially flat pole face as recited in claim 13, wherein there are twenty-four (24) rods.

15. An apparatus for site shimming a permanent magnet having a substantially flat pole face as recited in claim 14, wherein there are a pair of opposed pole faces symmetrically positioned parallel to one another.

16. An apparatus for site shimming a permanent magnet of the type having a pair of oppositely charged, parallel, substantially flat circular pole faces, comprising:

a plurality of thin flat ferromagnetic plates each having a first axis lying on one of a plurality of radial axes located in a plane parallel to and intermediate said pole faces, and a second axis perpendicular to said first axis; and rotating means associated with said pole face and each said plate for rotating each said plate about said first axis for orienting said second axis of each said plate at a specified angle with respect to said pole face.

17. An apparatus for site shimming a permanent magnet of the type having a pair of oppositely charged, parallel, substantially flat pole faces as recited in claim 16, further comprising translating means associated with said pole face and each said plate for radially translating each said plate along one of said radial axes to a specified radial location.

18. An apparatus for site shimming a permanent magnet of the type having a pair of oppositely charged, parallel, substantially flat pole faces as recited in claim 17, wherein said rotating means comprises a plurality of substantially straight support rods rotatably mounted on said pole face coaxially with each said radial axis.

19. An apparatus for site shimming a permanent magnet of the type having a pair of oppositely charged, parallel, substantially flat pole faces as recited in claim 18, wherein said plurality of support rods are positioned at equal angles from one another.

20. An apparatus for site shimming a permanent magnet of the type having a pair of oppositely charged, parallel, substantially flat pole faces as recited in claim 19, wherein said translating means comprises a pair of said plates being adjustably coupled in parallel relation about each said straight rod.

21. An apparatus for site shimming a permanent magnet having a substantially flat pole face as recited in claim 7, wherein said plates are rectangular.

22. An apparatus for site shimming a permanent magnet having a substantially flat pole face as recited in claim 7, wherein said plates are elliptical.

* * * * *